(12) United States Patent
Chen

(10) Patent No.: US 7,357,646 B1
(45) Date of Patent: Apr. 15, 2008

(54) REMOVABLE ELECTRONIC ASSEMBLY THAT REQUIRES VALIDATION

(75) Inventor: Kong-Chen Chen, San Jose, CA (US)

(73) Assignee: Wintec Industries, Inc., Fremont, CA (US)

(*) Notice: Subject to any disclaimer, the term of this patent is extended or adjusted under 35 U.S.C. 154(b) by 431 days.

(21) Appl. No.: 11/130,626

(22) Filed: May 16, 2005

Related U.S. Application Data

(60) Provisional application No. 60/571,980, filed on May 17, 2004.

(51) Int. Cl.
*H01R 12/00* (2006.01)
*H05K 1/00* (2006.01)

(52) U.S. Cl. ........................................................ 439/70

(58) Field of Classification Search ................ 439/70, 439/69, 912
See application file for complete search history.

(56) References Cited

U.S. PATENT DOCUMENTS

2007/0156366 A1* 7/2007 Johnson et al. ............. 702/123

* cited by examiner

*Primary Examiner*—Javaid Nasri
(74) *Attorney, Agent, or Firm*—Townsend and Townsend and Crew LLP

(57) ABSTRACT

A dual-in-line adaptor for mounting an electronic assembly that requires validation includes a pair of substantially parallel pin strips mounted to a first side of a dual-in-line adaptor circuit board and a first land pattern on at least one of the first side and a second side of the dual-in-line adaptor circuit board. The second side opposing the first side and the first land pattern corresponding to a second land pattern on the electronic assembly that requires validation. A method for testing an electronic assembly that requires validation using a dual-in-line adaptor is also described.

17 Claims, 6 Drawing Sheets

REMOVABLE ELECTRONIC ASSEMBLY THAT REQUIRES VALIDATION

CROSS REFERENCE TO RELATED APPLICATIONS

This application claims priority from U.S. Provisional Patent Application No. 60/571,980, filed on May 17, 2004, and entitled "Removable Electronic Assembly that Requires Validation," the disclosure of which is incorporated herein by reference.

BACKGROUND OF THE INVENTION

1. Field of the Invention

The present invention relates generally to modular electronic systems, and more particularly, to methods and systems for removably connecting modular electronic subsystems together.

2. Description of the Related Art

Many electronic products and systems include subsystems and subcomponents that must undergo validation testing and certification to ensure that the subsystem and subcomponent conforms to an established standard. One example of such a subsystem is a Bluetooth transceiver that can be used in any number of products (e.g., personal digital assistants, cellular telephones, computer keyboards, headsets, etc.). The Bluetooth technology is guided by an open specification for short-range wireless communication between electronic devices. A specific set of procedures has been defined by the Bluetooth Qualification Program (BQP) to minimize the interoperability problems among Bluetooth devices (e.g., Bluetooth transceivers). Each Bluetooth device must be tested to validate that the Bluetooth device is in compliance with the Bluetooth specifications. Other types of devices are governed by other specifications that must be validated. Bluetooth technology is an exemplary technology that must be validated; however, it should be understood that neither the present invention nor the problems described in the prior art are intended to be limited to Bluetooth technology or systems or devices that employ such technology that must be validated.

Validation of a Bluetooth device can be expensive in both time and financial commitments. The Bluetooth validation process requires third party testing to validate that the Bluetooth product meets the interoperability requirements (among several other aspects) required in the Bluetooth specification. Once the Bluetooth product has been so validated, the product is then certified by being registered with the Bluetooth organization.

The validation process is typically very time consuming and costly. Therefore repeating a product validation is something to be avoided if at all possible. One approach to avoiding repeated validation of a new device containing Bluetooth technology is to implement the Bluetooth device in a modular format. The modular Bluetooth device can then be validated. The validated, modular Bluetooth device can then be combined in any number of products without requiring each end product to be validated.

FIG. 1 is a top view of a typical Bluetooth module 100. The Bluetooth module 100 typically includes a printed circuit board (PCB) 102. A Bluetooth controller 104, RF devices 108A, 108B, and a flash memory 106 are surface mounted to the PCB 102. The flash memory 106 can store the Bluetooth protocol stack. An antenna 110 can also be surface mounted to the PCB 102.

Such Bluetooth modules are typically packaged in two formats. A first package format is packed as a multi-chip carrier (MCC), where the Bluetooth controller 104, flash memory 106, RF devices 108A, 108B and, optionally, some passive components, are assembled on the PCB 102 and then sealed in a ball grid array (BGA) package. The Bluetooth controller 104 and flash memory can also be stacked to reduce the area consumed by the device.

FIG. 2 shows a bottom side 112 of a typical MCC package. A set of land patterns 114 are provided on the bottom side 112 of the MCC package. For example, the land pattern 114 can be laid in an array on the bottom of the MCC package for making electrical contact to the main circuit board of the product that will include the validated, modular Bluetooth device. A more sophisticated MCC package includes solder balls attached to the land patterns to increase solderability.

A second package format includes surface-mounting the Bluetooth controller 104, flash memory 106, RF devices 108A, 108B and any optional passive components (e.g., antenna 110) on the top side of a PCB such as shown in FIG. 1 above. FIG. 3 shows a bottom side 112' of another typical MCC package. The bottom side 112' includes rows of land patterns 116 along the edge of the PCB 102 for mounting the Bluetooth module onto the main circuit board 128 of the product that will include the validated, modular Bluetooth device.

Electric signals are provided from the bottom edge of the PCB to the top layer, where all Bluetooth module components are populated. FIG. 4A is a detailed view of a portion of the edge of the PCB 102. To minimize the size of the validated, modular Bluetooth module, a half-cut, metal-plated via 126 is attached to each land pattern 116 from the edge of PCB 102.

FIG. 4B is a top view of validated, modular Bluetooth device 100 mounted to the main circuit board 128 of the product that will include the validated, modular Bluetooth device. The half-cut, metal-plated vias 126 provide additional area for solder connections 116" to the main circuit board 128 of the product that will include the validated, modular Bluetooth device. In either of the package formats described in FIGS. 2-4B above, the validated, modular Bluetooth device 100 is typically soldered to the main circuit board 128.

One of the main problems of either modular Bluetooth module package format is that once the modular Bluetooth device 100 is soldered on the main circuit board 128, it is extremely difficult to remove without damaging one or both of the Bluetooth device and the main circuit board. Further, a Bluetooth device 100 that can be removable from the main circuit board 128 can be very useful. By way of example, during the evaluation stage where different types (e.g., manufacturers, models, etc.) of Bluetooth modules could be evaluated on the same main circuit board 128 for a direct performance comparison.

There are several removable solutions available for the Bluetooth module 100. FIG. 5A shows a main circuit board 138 of a product connected to a Bluetooth module 100' with a Mictor connector 132. The Mictor connector 132 is mounted to the bottom side of Bluetooth module 100'. A properly chosen Mictor connector 132, for example a 38-pin version, can fit inside the board outline of a Bluetooth module 100'.

Unfortunately, the Mictor connector 132 is typically very small and not capable of providing sufficient mechanical support for the Bluetooth module 100'. As a result, additional mechanical support is typically required by adding supporting bar or supporting posts 136 and corresponding mounting holes near the opposite end of the Bluetooth module 100' from the Mictor connector 132 to ensure the Bluetooth module can be securely attached to the main circuit board 138.

FIG. 5B shows a main circuit board 140 of another product connected to a Bluetooth module 100" with a dual pin header 142. The dual pin header 142 is less costly and provides increased mechanical support as compared to a comparably sized Mictor connector 132. Supporting posts 136 can also be used with the dual pin header 142.

FIG. 5C shows another approach to provide a removable Bluetooth module 100 as a Bluetooth USB 150 dongle. The validated, modular Bluetooth module 100 is mounted on a PCB 152 that includes a USB connector 154 to form the Bluetooth USB dongle 150. The Bluetooth USB dongle 150 is a convenient solution to support the removability of the Bluetooth module 100.

Unfortunately, the Bluetooth USB dongle 150 can only be used with a main circuit board 156 of a product that includes a corresponding USB interface 158 that can connect to the USB connector 154. Many applications for the Bluetooth module 100 do not include a USB interface. By way of example, a typical micro-controller based embedded system typically does not include a USB interface. The Universal Asynchronous Receiver-Transmitter (UART) interface is more commonly used in such micro-controller based embedded systems.

In view of the foregoing, there is a need for an easy to use and inexpensive connection interface that provides sufficient mechanical support and allows the easy removability of a validated, modular Bluetooth device from a main circuit board of the product that will include the Bluetooth device.

SUMMARY OF THE INVENTION

Broadly speaking, the present invention fills these needs by providing an easy to use, inexpensive, removable connection interface for a validated, modular Bluetooth device. It should be appreciated that the present invention can be implemented in numerous ways, including as a process, an apparatus, a system, computer readable media, or a device. Several inventive embodiments of the present invention are described below.

A first embodiment provides a dual-in-line adaptor for mounting an electronic assembly that requires validation includes a pair of substantially parallel pin strips mounted to a first side of a dual-in-line adaptor circuit board and a first land pattern on at least one of the first side and a second side of the dual-in-line adaptor circuit board. The second side opposing the first side and the first land pattern corresponding to a second land pattern on the electronic assembly that requires validation.

The electronic assembly that requires validation can include a Bluetooth module. The electronic assembly that requires validation can be soldered to the at least one of the first side and a second side of the dual-in-line adaptor circuit board such that the first land pattern and the second land pattern align and connect a corresponding first set of connections and a corresponding second set of connections.

The first land pattern can include a first set of connections being electrically connected to one or more corresponding pins in the pin strips. The dual-in-line adaptor can also include additional components mounted on the opposing side of the adapter circuit board from the electronic assembly that requires validation. The additional components can be related to the electronic assembly that requires validation.

The dual-in-line adaptor can be removably coupled to a circuit board in a product. At least one component mounted on the circuit board in the product can be mounted under the dual-in-line adaptor.

The dual-in-line adaptor can have a footprint larger than the electronic assembly that requires validation. The pair of substantially parallel pin strips can include at least one keyed pin. The at least one keyed pin can include an absence of at least one pin.

The pair of substantially parallel pin strips can include more than two substantially parallel pin strips. The more than two substantially parallel pin strips can include pin strips arranged in a substantially rectangular arrangement. Each one of the pair of substantially parallel pin strips can include a corresponding housing.

Another embodiment provides a removable Bluetooth module including a dual-in-line adaptor having the Bluetooth module mounted thereon. The dual in-line adapter including a pair of substantially parallel pin strips mounted to a first side of a dual-in-line adaptor circuit board and a first land pattern on at least one of the first side and a second side of the dual-in-line adaptor circuit board. The second side opposing the first side and the first land pattern corresponding to a second land pattern on the Bluetooth module.

The removable Bluetooth module can also include additional components mounted on the opposing side of the adapter circuit board from the Bluetooth module. The additional components include passive components for the Bluetooth module.

Yet another embodiment provides a method of testing a product. The method including installing a removable first Bluetooth DIP adapter into the product and testing the product to produce a first set of test results. The method continues with removing the removable first Bluetooth DIP adapter from the product and installing a removable second Bluetooth DIP adapter into the product. The product can then be tested to produce a second set of test results.

The present invention provides an inexpensive, mechanical secure connection mechanism for electronic modules and can be especially useful for electronic modules that require validation such as Bluetooth modules. The present invention allows ease of testing and ease of integration of pre-certified Bluetooth modules into a product.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION OF THE EXEMPLARY EMBODIMENTS

Several exemplary embodiments for an easy to use, inexpensive, removable connection interface for a validated, modular Bluetooth device will now be described. It will be apparent to those skilled in the art that the present invention may be practiced without some or all of the specific details set forth herein.

One embodiment of the current invention uses a dual-in-line package (DIP) adaptor for mounting the Bluetooth module to allow the Bluetooth module and DIP adaptor to be disconnected/removed from the system. The DIP adaptor includes two rows of pin strips along the edges and a land pattern in the center. The land pattern corresponds to contacts on a validated Bluetooth module. The pin strip may also include a support housing. The pin strips can be a through-hole type or a surface-mounted type. A mounting hole and post can also be added to the DIP adaptor to provide additional mechanical support. The DIP adaptor can be directly mounted on the main circuit board or can be inserted into a pin-strip socket on the main circuit board.

Figure 6A:
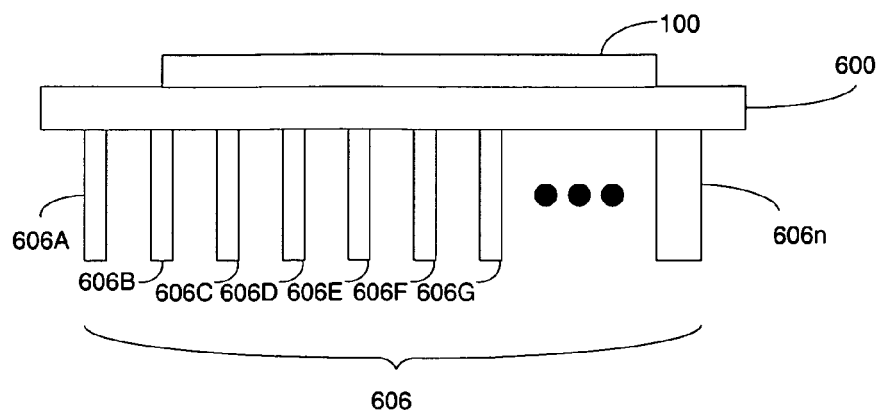
FIG. 6A is a side view of a Bluetooth module DIP adaptor, in accordance with one embodiment of the present invention.

FIG. 6A is a side view of a Bluetooth module DIP adaptor 600, in accordance with one embodiment of the present invention. The Bluetooth module DIP adaptor 600 includes a validated Bluetooth module 100 mounted on the DIP adaptor. The Bluetooth module DIP adaptor 600 also includes a strip of connector pins 608 (hidden) and 606 on each side of the DIP adaptor. The strip of connector pins 606 and 608 on each side of the DIP adaptor can be continuous or segmented. By way of example, if some of the pins (e.g. pins 606C and 606D) in the strip of connector pins 606 are not needed, then the unneeded pins can be deleted. One or more of the pins 606A-606n (e.g., pin 606n) can have a different size so as to be used as a "key" to align the Bluetooth module DIP adaptor 600 in the circuit board (not shown) to which the Bluetooth module DIP adaptor is connected.

Figure 6B:
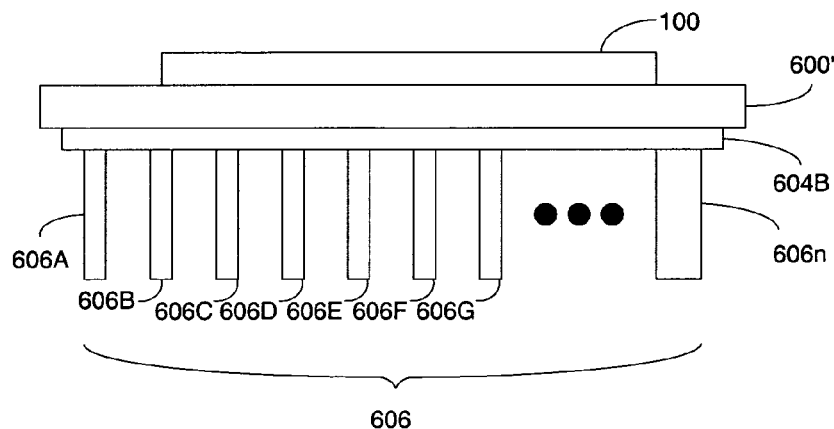
FIG. 6B is a side view of an alternative Bluetooth module DIP adaptor, in accordance with one embodiment of the present invention.

FIG. 6B is a side view of an alternative Bluetooth module DIP adaptor 600', in accordance with one embodiment of the present invention. The Bluetooth module DIP adaptor 600' includes a strip of connector pins 608 (hidden) and 606 on each side of the DIP adaptor. Each strip of the strip of connector pins 608 and 606 include a corresponding housing 604A (hidden) and 604B. The corresponding housing 604A and 604B provide additional structural support to the corresponding strips of connector pins 608 and 606.

Figure 1:
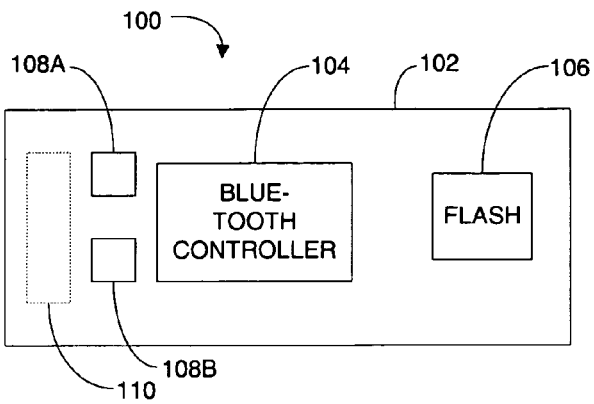
FIG. 1 is a top view of a typical Bluetooth module.
Figure 2:
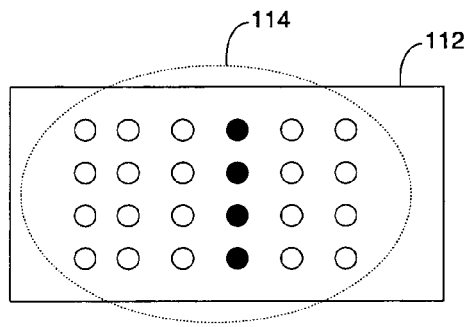
FIG. 2 shows a bottom side of a typical MCC package.
Figure 3:
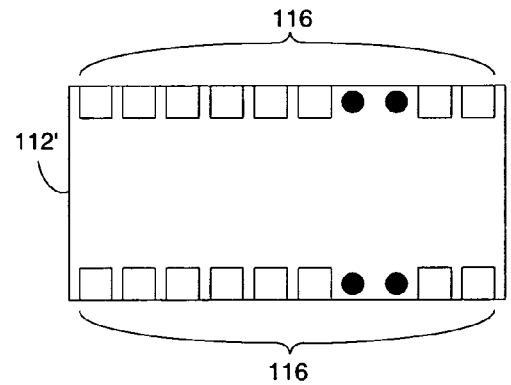
FIG. 3 shows a bottom side of another typical MCC package.
Figure 4A:
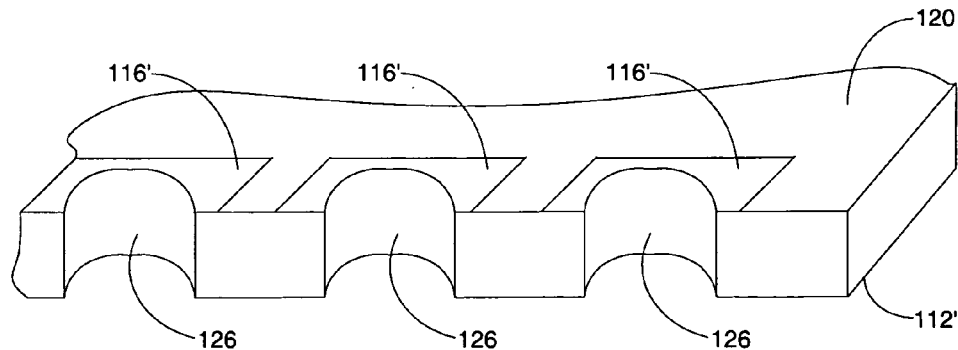
FIG. 4A is a detailed view of a portion of the edge of the PCB.
Figure 4B:
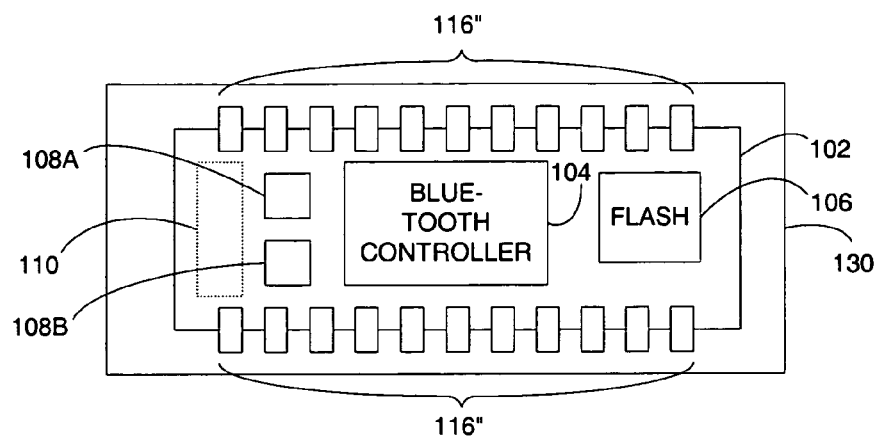
FIG. 4B is a top view of validated, modular Bluetooth device mounted to the main circuit board of the product that will include the validated, modular Bluetooth device.
Figure 5A:
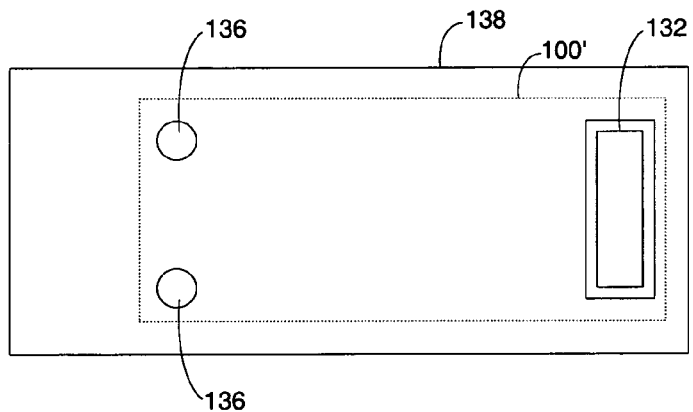
FIG. 5A shows a main circuit board of a product connected to a Bluetooth module with a Mictor connector.
Figure 5B:
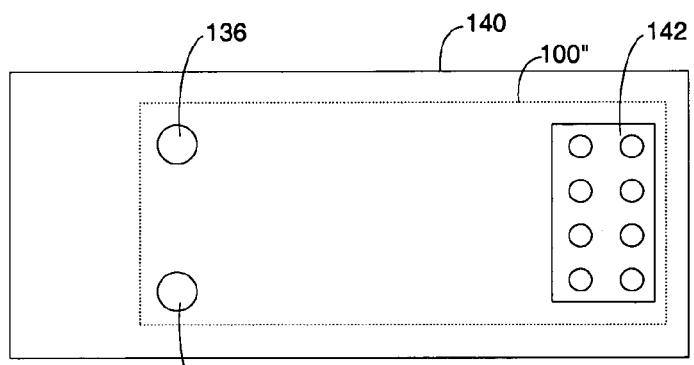
FIG. 5B shows a main circuit board of another product connected to a Bluetooth module with a dual pin header.
Figure 5C:
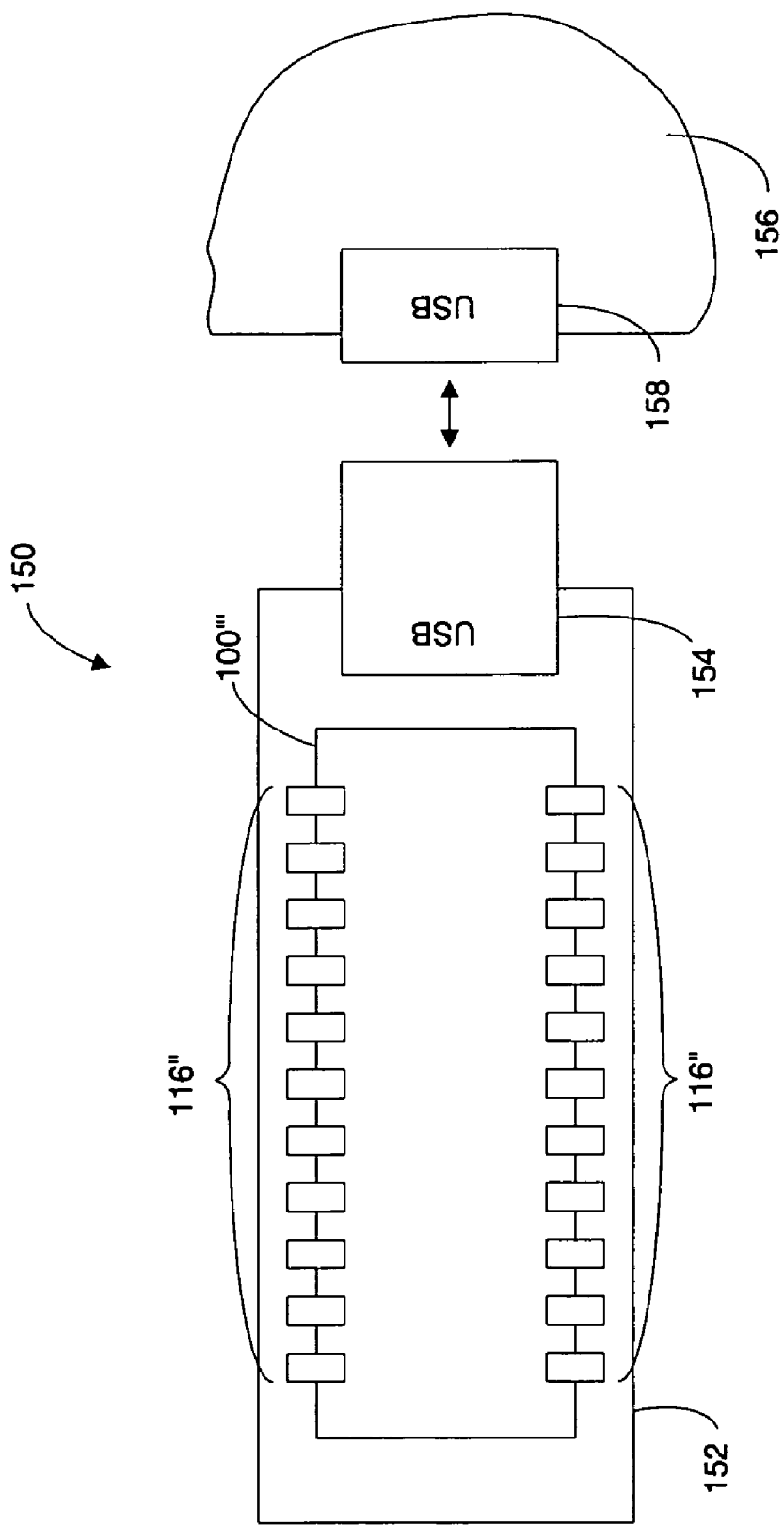
FIG. 5C shows another approach to provide a removable Bluetooth module is a Bluetooth USB dongle.
Figure 6C:
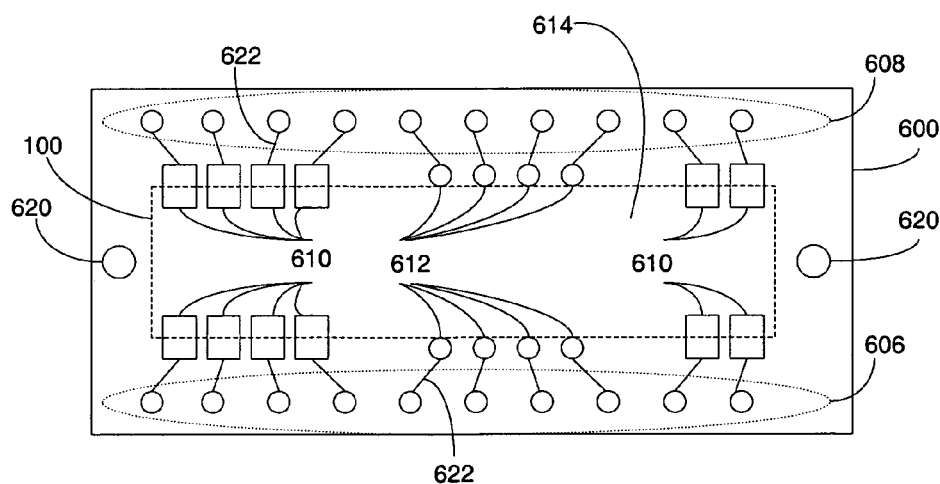
FIG. 6C is a top view of the Bluetooth module DIP adaptor, in accordance with one embodiment of the present invention.

FIG. 6C is a top view of the Bluetooth module DIP adaptor 600, in accordance with one embodiment of the present invention. The Bluetooth module DIP adaptor 600 includes a land pattern 614 that includes contact pads 610, 612 that correspond to contacts on the validated Bluetooth module 100. In the embodiment shown in FIG. 6C, the footprint of the DIP adapter 600 is larger than the validated Bluetooth module 100 because the strips of connector pins 608 and 606 are sufficiently separated to allow the validated Bluetooth module 100 to be mounted between the strips of connector pins. Because the DIP adapter 600 has a footprint larger than the validated Bluetooth module 100, the contact pads 610, 612 can connect to corresponding land pattern 116 and 116' (as shown in FIGS. 3-4B above) on the edge of the validated Bluetooth module or to a set of land patterns 114 (as shown in FIG. 2 above) that are located on the bottom surface of the validated Bluetooth module 100. Further, having the footprint of the DIP adapter 600 larger than the validated Bluetooth module 100 provides excellent mechanical support to the Bluetooth module DIP adapter 600 assembly.

Alternatively, the footprint of the DIP adapter 600 can be smaller than the validated Bluetooth module 100. By way of example, the strips of connector pins 608 and 606 can be too close together to allow the validated Bluetooth module 100 to be mounted between the strips of connector pins. The smaller footprint DIP adapter 600 allows for a more compact connection to the main circuit board of the product that uses the Bluetooth module DIP adapter.

The land pattern 614 includes conductive traces 622 that connect the contact pads 610, 612 to the corresponding pins in the strips of connector pins 608 and 606. Additional mounting studs 620 can optionally be used to provide additional mechanical support between the Bluetooth module DIP adaptor 600 and a main circuit board of the product the Bluetooth module DIP adaptor is connected to.

In addition to being removable, the DIP adaptor 600 has other advantages. One advantage is that the DIP adaptor 600 provides a minimal distance between the contact pads 610, 612 and the corresponding pins in the strips of connector pins 608 and 606. This minimal distance reduces routing issues as compared to the prior art Mictor connector, dual pin header, or USB interface.

Figure 7:
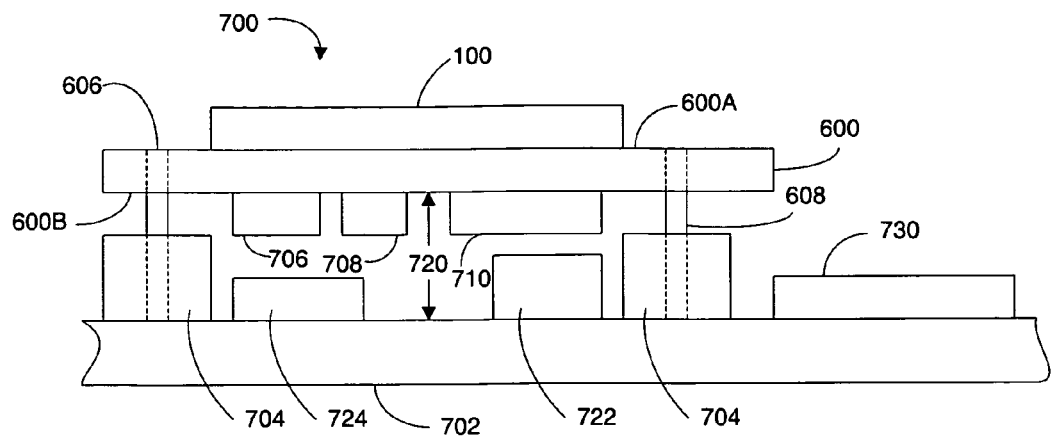
FIG. 7 is an end view of a Bluetooth module DIP adaptor coupled to a main circuit board, in accordance with one embodiment of the present invention

FIG. 7 is an end view 700 of a Bluetooth module DIP adaptor 600 coupled to a main circuit board 702, in accordance with one embodiment of the present invention. The pins in the strips of connector pins 608 and 606 connect to corresponding connectors 704 on the main circuit board 702. In one embodiment, the connectors 704 are mounted on the surface of the main circuit board 702. Alternatively, the connectors 704 can be integrated into the main circuit board 702. The pins in the strips of connector pins 608 and 606 are shown extending through the Bluetooth module DIP adaptor 600, however, it should be understood that the pins can be surface mounted to the bottom side 600B of the Bluetooth module DIP adaptor. The main circuit board 702 includes many components 722, 724, 730 that may use the Bluetooth module 100 to communicate with another device.

The length of the pins in the strips of connector pins 608 and 606 can be selected to provide a desired amount of difference between the Bluetooth module DIP adaptor 600 coupled to the main circuit board 702. By way of example, the length of the pins in the strips of connector pins 608 and 606 can be minimized to cause a space between the Bluetooth module DIP adaptor 600 and the main circuit board 702 to be minimized.

Alternatively, as shown in FIG. 7, the length of the pins in the strips of connector pins 608 and 606 can be lengthened sufficiently to provide a desired space 720 between the Bluetooth module DIP adaptor 600 and the main circuit board 702. The space 720 allows other Bluetooth external supporting devices, such as voltage regulator 706, power-on reset circuit 708 and decoupling capacitors 710 to be mounted at the bottom side 600B of the DIP adaptor 600, whereas the Bluetooth module 100 is mounted at the top side 600A of the DIP adaptor 600. Further, the space 720 can also allow components 722 and 724 to be placed on the main circuit board 702 under the Bluetooth module DIP adaptor 600. In this manner the Bluetooth module DIP adaptor 600 allows more efficient use of the space on the main circuit board 702.

Figure 8A:
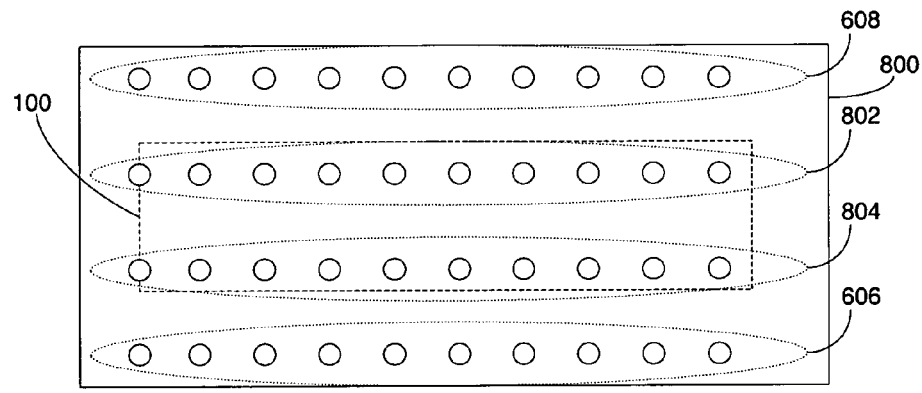
FIGS. 8A and 8B show exemplary alternative arrangements of the Bluetooth module DIP adapter, in accordance with one or more embodiments of the present invention.
Figure 8B:
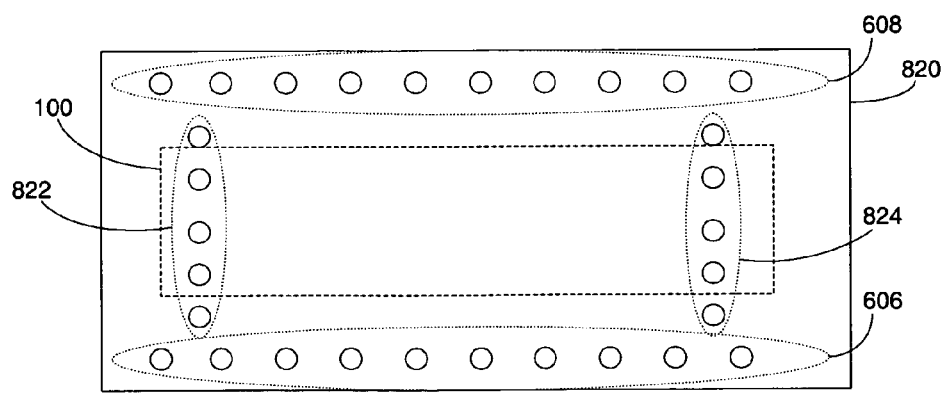

With the above embodiments in mind it should be understood that the Bluetooth module DIP adapter may have additional configurations. FIGS. 8A and 8B show exemplary alternative arrangements 800, 820 of the Bluetooth module DIP adapter, in accordance with one or more embodiments of the present invention. Referring now to FIG. 8A, the Bluetooth module DIP adapter 800 includes multiple pairs of parallel pin strips 606, 608, 802 and 804. As shown in FIG. 8A, the multiple pairs of parallel pin strips 606, 608, 802 and 804 can be arranged substantially aligned and parallel. However, it should be understood that the pairs of parallel pin strips could be offset or set at an angle. By way of example, a first pair of pin strips could include pin strips 608 and 802 and a second pair of pin strips could include pin strips 804 and 606. The first pair of pin strips 608 and 802 could be shifted to left with respect to the second pair of pin strips 804 and 606.

Referring now to FIG. 8B, a first pair of pin strips 606 and 608 and a second pair of pin strips 822 and 824 can be arranged substantially perpendicular to form a substantially rectangular arrangement of pin strips. Multiple pairs of pin strips provide more flexible uses in that the number of electrical connections can be increased and located where most easily used. Further the multiple pairs of pin strips provide additional mechanical support. Further still, each one the pin strips are not required to have the same length as the other pin strips, further providing flexibility in design and potential applications.

Figure 9:
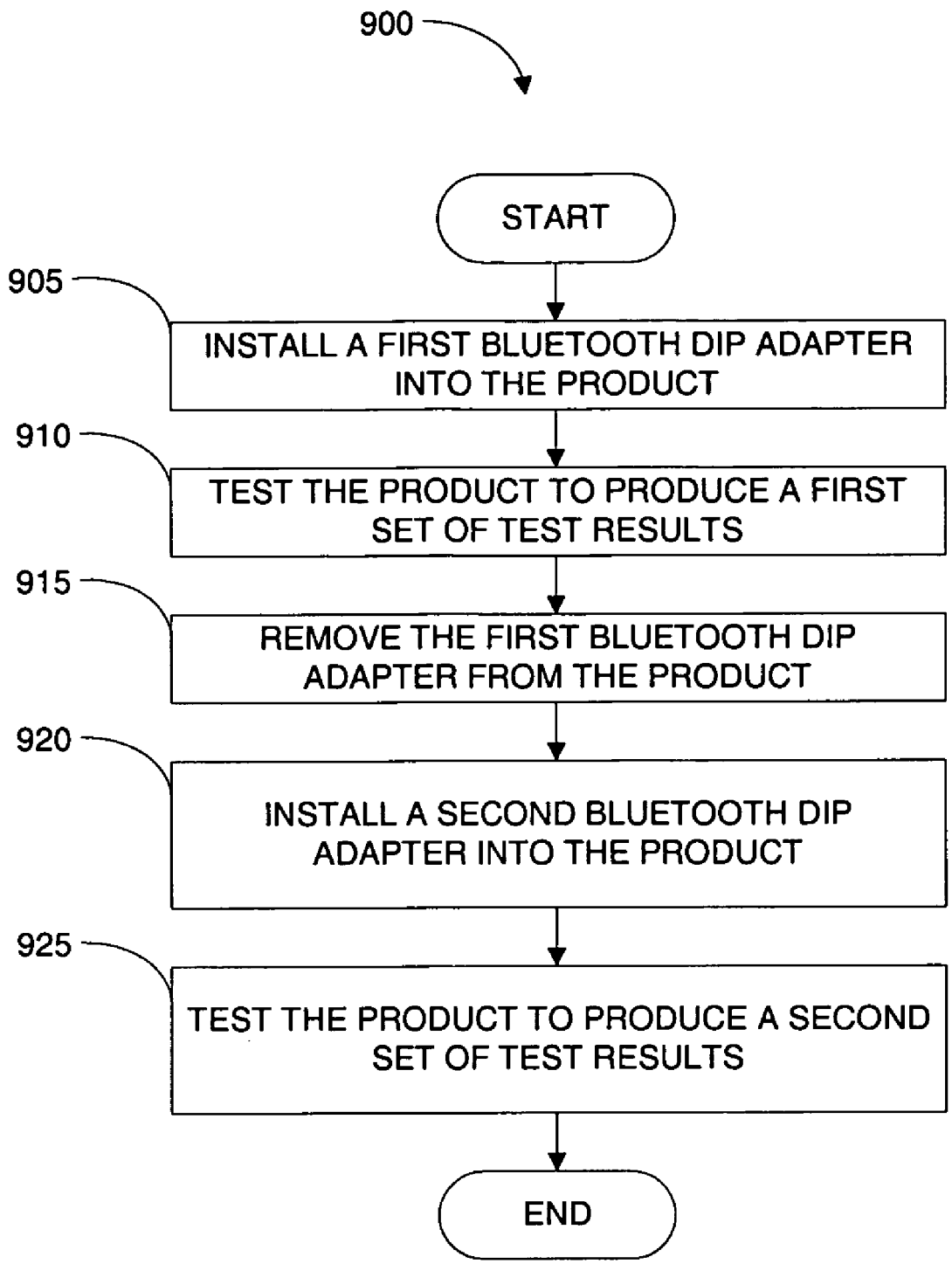
FIG. 9 is a flowchart diagram that illustrates the method operations performed in testing multiple Bluetooth module DIP adapters in a single product, in accordance with one embodiment of the present invention.

FIG. 9 is a flowchart diagram that illustrates the method operations 900 performed in testing multiple Bluetooth module DIP adapters in a single product, in accordance with one embodiment of the present invention. In an operation 905, a removable first Bluetooth DIP adapter is installed into a product to be tested. In an operation 910, one or more tests are performed on the product to evaluate the operation of the product and to produce a first set of test results.

In an operation 915, the removable first Bluetooth DIP adapter is removed from the product. In an operation 920, a removable second Bluetooth DIP adapter is installed into the product. In an operation 925, the one or more tests are performed on the product to evaluate the operation of the product and to produce a second set of test results.

The first and second sets of test results can then be used to evaluate the operation of the product with the respective first and second removable first Bluetooth DIP adapters. In similar manner multiple Bluetooth modules can easily be evaluated for use or incorporated into the manufacturing of a product.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A dual-in-line adaptor for mounting an electronic assembly that requires validation comprising:
    a pair of substantially parallel pin strips mounted to a first side of a dual-in-line adaptor circuit board; and
    a first land pattern on at least one of the first side and a second side of the dual-in-line adaptor circuit board, the second side opposing the first side, the first land pattern corresponding to a second land pattern on the electronic assembly that requires validation;
    wherein the pair of substantially parallel pin strips includes at least one keyed pin.

2. The dual-in-line adaptor of claim 1, wherein the electronic assembly that requires validation includes a Bluetooth module.

3. The dual-in-line adaptor of claim 1, wherein the electronic assembly that requires validation is soldered to the at least one of the first side and the second side of the dual-in-line adaptor circuit board such that the first land pattern and the second land pattern align and connect a corresponding first plurality of connections and a corresponding second plurality of connections.

4. The dual-in-line adaptor of claim 1, wherein the first land pattern includes a first plurality of connections being electrically connected to one or more corresponding pins in the pin strips.

5. The dual-in-line adaptor of claim 1, further comprising additional components mounted on the opposing side of the dual-in-line adapter circuit board from the electronic assembly that requires validation.

6. The dual-in-line adaptor of claim 5, wherein the additional components are related to the electronic assembly that requires validation.

7. The dual-in-line adaptor of claim 1, wherein the dual-in-line adaptor is removably coupled to a circuit board in a product.

8. The dual-in-line adaptor of claim 7, wherein at least one component mounted on the circuit board in the product is mounted under the dual-in-line adaptor.

9. The dual-in-line adaptor of claim 1, wherein the dual-in-line adaptor circuit board has a footprint larger than the electronic assembly that requires validation.

10. The dual-in-line adaptor of claim 1, wherein the at least one keyed pin has a size different from that of rest of the pair of substantially parallel pin strips.

11. The dual-in-line adaptor of claim 1, wherein the at least one keyed pin includes an absence of at least one pin.

12. The dual-in-line adaptor of claim 1, further comprising two or more additional substantially parallel pin strips.

13. The dual-in-line adaptor of claim 12, wherein the two or more additional substantially parallel pin strips and the pair of substantially parallel pin strips are arranged in a substantially rectangular arrangement.

14. The dual-in-line adaptor of claim 1, wherein each one of the pair of substantially parallel pin strips includes a corresponding housing.

15. A removable Bluetooth module comprising:
    a dual-in-line adaptor having the Bluetooth module mounted thereon the dual in-line adapter including:

a pair of substantially parallel pin strips mounted to a first side of a dual-in-line adaptor circuit board, wherein the pair of substantially parallel pin strips includes at least one keyed pin; and a first land pattern on at least one of the first side and a second side of the dual-in-line adaptor circuit board, the second side opposing the first side, the first land pattern corresponding to a second land pattern on the Bluetooth module.

16. The removable Bluetooth module of claim 15, further comprising additional components mounted on the opposing side of the adapter circuit board from the Bluetooth module.

17. The removable Bluetooth module of claim 16, wherein the additional components include passive components for the Bluetooth module.

\* \* \* \* \*